(12) United States Patent  
Guo et al.

(10) Patent No.: US 9,188,611 B2  
(45) Date of Patent: *Nov. 17, 2015

(54) RESAMPLING A SIGNAL TO PERFORM POWER QUALITY MEASUREMENT

(75) Inventors: Qiao Guo, Shanghai (CN); Chen Zhang, Shanghai (CN); Yijun Shi, Shanghai (CN)

(73) Assignee: National Instruments Corporation, Austin, TX (US)

( * ) Notice: Subject to any disclaimer, the term of this patent is extended or adjusted under 35 U.S.C. 154(b) by 755 days.

This patent is subject to a terminal disclaimer.

(21) Appl. No.: 13/326,626

(22) Filed: Dec. 15, 2011

(65) Prior Publication Data

US 2013/0158906 A1    Jun. 20, 2013

(51) Int. Cl.
- *G01R 21/00* (2006.01)
- *G01R 21/133* (2006.01)
- *G01R 19/25* (2006.01)

(52) U.S. Cl.
CPC .......... *G01R 21/133* (2013.01); *G01R 19/2513* (2013.01); *Y02E 60/728* (2013.01); *Y04S 10/265* (2013.01)

(58) Field of Classification Search
CPC . Y04S 10/265; Y02E 60/728; G01R 19/2513; G01R 21/133
See application file for complete search history.

(56) References Cited

U.S. PATENT DOCUMENTS

| 4,914,568 | A | 4/1990 | Kodosky et al. |
|---|---|---|---|
| 5,196,982 | A | 3/1993 | Landsberg et al. |
| 6,043,642 | A | 3/2000 | Martin et al. |
| 6,219,628 | B1 | 4/2001 | Kodosky et al. |
| 6,437,995 | B2 | 8/2002 | Ainsworth et al. |
| 7,210,117 | B2 | 4/2007 | Kudukoli et al. |
| 7,366,631 | B2 | 4/2008 | Steger et al. |
| 7,904,261 | B2 | 3/2011 | Atanackovic et al. |
| 8,108,166 | B2 | 1/2012 | Arnold et al. |
| 2008/0071482 | A1* | 3/2008 | Zweigle et al. ................. 702/62 |
| 2010/0292857 | A1* | 11/2010 | Bose et al. .................... 700/292 |
| 2011/0080197 | A1* | 4/2011 | Fan et al. ...................... 327/156 |

OTHER PUBLICATIONS

Perez, Eduardo, Labview DSP—A Hands-On DSP Educational Platform, IEEE, 2009.*

(Continued)

*Primary Examiner* — Timothy H Hwang

(74) *Attorney, Agent, or Firm* — Meyertons Hood Kivlin Kowert & Goetzel, P.C.; Jeffrey C. Hood; Joel L. Stevens

(57) ABSTRACT

Performing power quality and synchrophasor analysis on a resampled signal. A first signal may be initially received which corresponds to a power system. The first signal may have a plurality of cycles and may have a frequency that varies over time. One or more parameters may be determined from the first signal. Based on the one or more parameters, the first signal may be resampled to produce an even angle signal. Various power quality measurements may be performed on the even angle signal. Similarly, further processing may be performed to perform synchrophasor measurements, e.g., to determine phasor, frequency, and/or rate of frequency change for the first signal. In some embodiments, the resampling processing elements (e.g., circuitry, programmable hardware elements, processors and memories, etc.) may be shared between the two analysis.

16 Claims, 13 Drawing Sheets

(56) References Cited

OTHER PUBLICATIONS

TechTarget, Definition of Chassis, http://whatis.techtarget.com/definitio/chass?vgnextfmt=print, (May 17, 2008).*

OAT Convert to Even Angle Signal (Sound and Vibration Measurement Suite), National Instruments, http://zone.ni.com/reference/en-XX/help/372416A-01/voat/oat_conv_even_angle/, Dec. 2007, 3 pages [Retrieved Dec. 28, 2011].*

Amanci, Adrian Z. et al., Synchronization System with Zero-Crossing Peak Detection Algorithm for Power System Applications, The 2010 International Power Electronics Conference, IEEE, 2010.*

National Instruments Corporation, Methods for Performing Order Analysis (Sound and Vibration Measurement Suite), 2009, http://zone.ni.com/reference/en-XX/help/372416C-01/svtconcepts/oa_methods/, 3 pages. [Retrieved Mar. 5, 2012].

ENA: Elcom Network Analyzer—Overview: ENA-Node instrument firmware functionality, Elcom, a.s.—Division of Virtual Instrumentation, Version 2.8.0, Jul. 2009, 14 pages.

Daniel Kaminsky, Jan Zidek and Petr Bilik, "Virtual Instrumentation Based Power Quality Analyzer," The 6th IEEE International Conference on Intelligent Data Acquisition and Advanced Computing Systems: Technology and Applications, Sep. 15-17, 2011, pp. 184-187.

OAT Convert to Even Angle Signal (Sound and Vibration Measurement Suite), National Instruments, http://zone.ni.com/reference/en-XX/help/372416A-01/lvoat/oat_conv_even_angle/, Dec. 2007, 3 pages. [Retrieved Dec. 28, 2011].

* cited by examiner

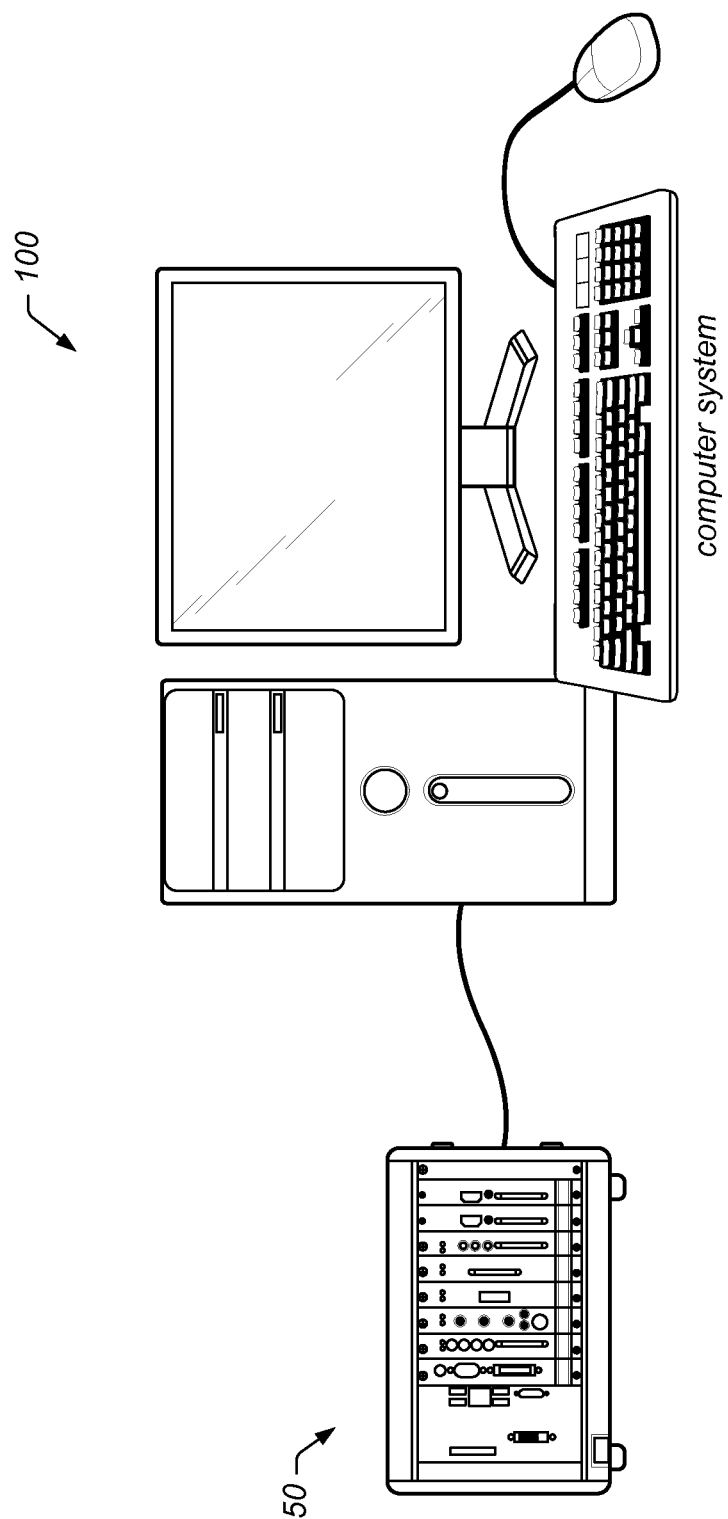

RESAMPLING A SIGNAL TO PERFORM POWER QUALITY MEASUREMENT

FIELD OF THE INVENTION

The present invention relates to the field of signal analysis, and more particularly to a system and method for performing power measurement.

DESCRIPTION OF THE RELATED ART

In recent years, a plethora of systems and devices have been developed which must meet certain requirements, such as power quality parameters defined in IEC 61000-4-30 and synchrophasor requirements defined in IEEE C37.118, among others.

For example, a power quality analyzer may perform the measurement on the parameters defined in standards so that customers can maintain power system, troubleshoot power problems, or diagnose equipment failures, etc. As a specific example, a customer whose operating equipment is unusually sensitive to voltage events may negotiate contracts with electrical utilities. Such contracts typically provide general provisions, such as power quality parameters. The measuring instruments used for the purpose of a contract are to comply with technical requirements set forth in the standard. Thus, from the consumer's perspective, a power quality analyzer is needed, e.g., in order to monitor the power quality parameters to reduce costs, avoid downtime, or increase the service life of their system. From the utility's perspective, the power quality analyzer is needed to monitor and implement effective control and protection systems.

A synchrophasor measurement unit (or "PMU") provides another example. For example, a phasor is a vector that may be used to fully characterize and compare AC voltage or current signals. The angle difference may provide an indicator of grid stress. A PMU offers a means for capturing wide-area snapshots of phase angle profiles and comparing them. A synchrophasor measurement unit may be typically useful for power transmission network.

However, analyzers for monitoring or measuring these systems may need to deal with a plurality of different types of such systems, e.g., operating at different frequencies, with variable frequencies, etc. Generally, performing such measurements for the wide variety of available power systems in a consistent manner is difficult. Accordingly, improvements in measurements, such as power quality measurement and synchrophasor measurement, are desired.

SUMMARY OF THE INVENTION

Various embodiments of a system and method for performing signal analysis are presented below.

A first signal may be received that corresponds to a power system. For example, an analog signal (e.g., corresponding to voltage, current, etc.) may have been received and converted to a digital signal using an analog to digital converter (ADC). The first signal may include a plurality of cycles, e.g., having a frequency that varies over time.

Accordingly, zero crossing detection may be performed on the first signal. The zero crossing detection may be used to determine start and end positions of each of the plurality of cycles. Using the start and end positions, even angle positions of the first signal may be determined. Additionally, the zero crossing detection may be used to determine a fundamental frequency of the first signal. The fundamental frequency may be used to determine a sampling rate that will not result in aliasing of the first signal when resampled, e.g., according to the Nyquist theorm.

Accordingly, the first signal may be resampled at the even angle positions to produce an even angle signal. Various tests or measurements may be performed using the even angle signal. For example, various power quality measurements may be performed using the even angle signal to perform power quality analysis. Similarly, various synchrophasor measurements and/or processing may be performed using the even angle signal to perform synchrophasor analysis.

In one embodiment, a device may be configured to perform both synchrophasor measurement and power quality analysis and may share the circuitry, programmable hardware elements, and/or processors and memories to perform the resampling described above. Accordingly, the system may be able to share the processing resources to perform the resampling and perform the measurements using the output from the resampling algorithm. Thus, the processing elements implementing the resampling algorithm may be shared between two different tests or measurements in a single system. Such sharing may allow for a cheaper and more efficient footprint for the system.

BRIEF DESCRIPTION OF THE DRAWINGS

A better understanding of the present invention can be obtained when the following detailed description of the preferred embodiment is considered in conjunction with the following drawings, in which:

FIGS. 1A-1C illustrate exemplary systems, according to various embodiments;

Figure 1A:
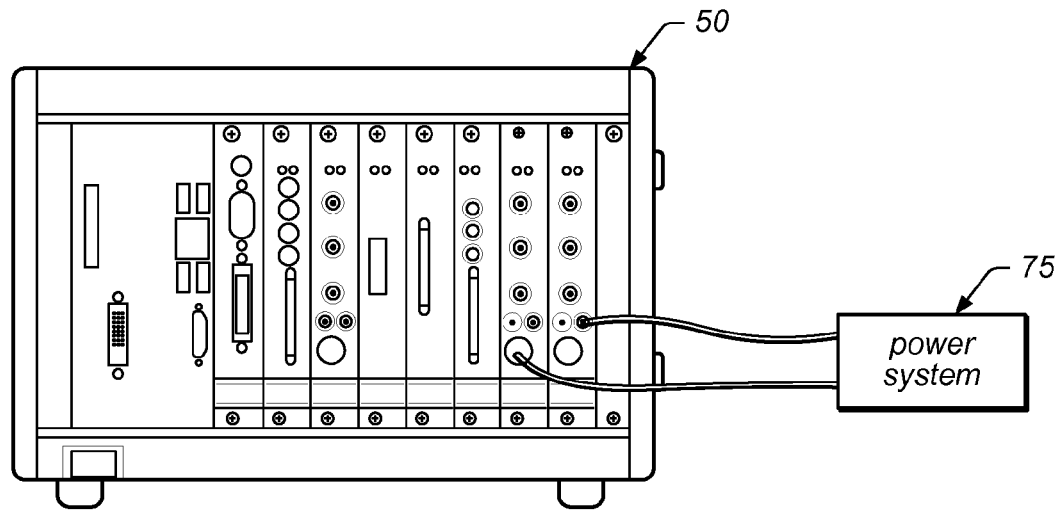

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 4,914,568, titled "Graphical System for Modeling a Process and Associated Method", issued on Apr. 3, 1990.

U.S. Pat. No. 6,219,628, titled "System and Method for Configuring an Instrument to Perform Measurement Functions Utilizing Conversion of Graphical Programs into Hardware Implementations", filed Aug. 18, 1997.

U.S. Pat. No. 7,210,117, titled "System and Method for Programmatically Generating a Graphical Program in Response to Program Information", filed Dec. 20, 2000.

U.S. Pat. No. 7,366,631, titled "Programmable Hardware Element with Cartridge Controllers for Controlling Modular Cartridges that Convey Interface Information", filed Jun. 6, 2007.

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Figure 1B:
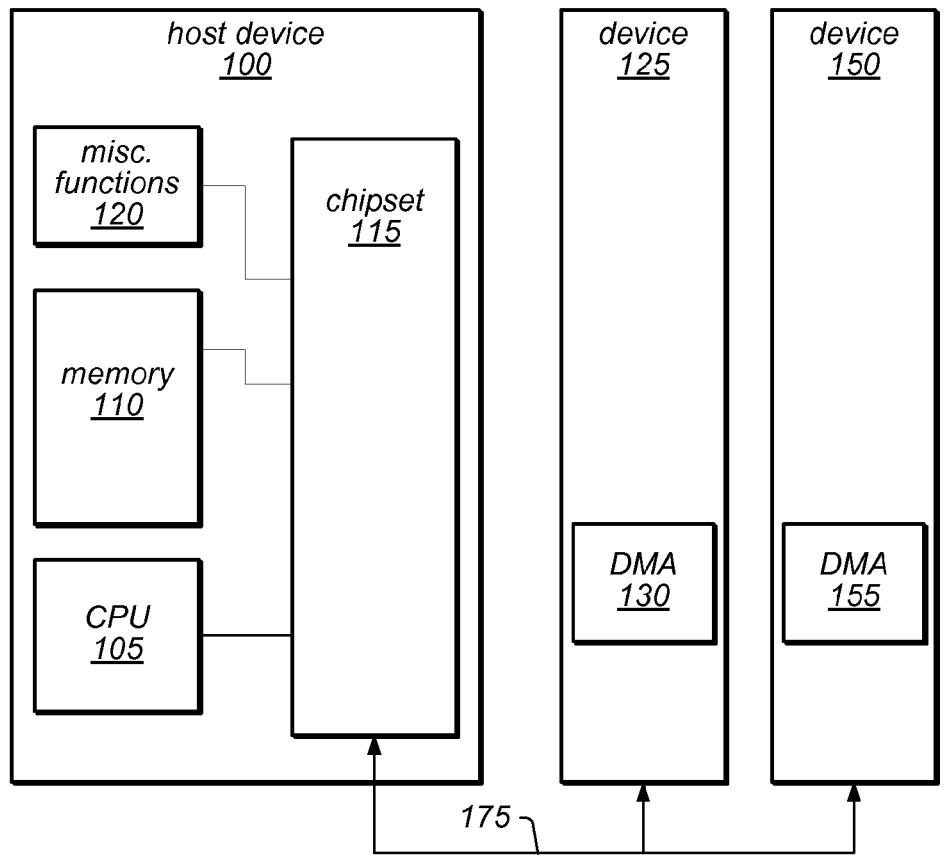

FIGS. 1A-1C—Exemplary Systems

FIGS. 1A-1C illustrate exemplary systems which may implement embodiments described herein. As shown in FIG. 1A, an exemplary chassis 50 is coupled to a power system 75. The power system may be any of various devices or systems, such as a power grid, power poles, semiconductor manufactory, residential systems, etc. In one embodiment, the chassis 50 may be configured to perform power measurement, such as power quality analysis, synchrophasor analysis, etc. on signals acquired from the power system 75. In one embodiment, the chassis may acquire measurements of the power system, such as current, voltage, etc., e.g., using analog sensors. These signals may be processed in the manner described herein.

FIG. 1B illustrates an exemplary block diagram of one embodiment of the chassis 50. As shown, the chassis 50 may include a host device 100 (e.g., a host controller board), which may include a CPU 105, memory 110, and chipset 115. Other functions that may be found on the host device 100 are represented by the miscellaneous functions block 120. In some embodiments, the host device 100 may include a processor and memory (as shown) and/or may include a programmable hardware element (e.g., a field programmable gate array (FPGA)). Additionally, one or more of the cards or devices (e.g., device 125 and/or 150) may also include a programmable hardware element. In further embodiments, a backplane of the chassis 50 may include a programmable hardware element. In embodiments including a programmable hardware element, it may be configured according to a graphical program as described in the various patents incorporated by reference above.

As shown, the host device 100 (e.g., the chipset 115 of the host device 100) may provide communication (e.g., PCIe communication, PXI communication, or other bus communication) to a first peripheral device 125 and a second peripheral device 150 over bus 175. The first peripheral device 125 and second peripheral device 150 may be configured to change configurations based on information provided by the host device 100, as described herein.

The devices may be any of various devices (e.g., PCIe devices), such as measurement devices (e.g., DAQ devices), processing devices, I/O devices, network devices, etc. Additionally, similar to above, the devices may include one or more programmable hardware elements or processors and memory to implement their respective functionality. In some embodiments, the devices 125 and 150 may be configured to acquire signals from the power system 75 to perform power measurement. For example, the device 125 may be configured to measure and perform analog to digital conversion for voltage of the power system 75. Similarly, the device 150 may be configured to measure and perform analog to digital conversion for current of the power system 75. Further devices may be included in the chassis 50, such as devices for performing GPS measurements, e.g., acquiring time using GPS circuitry for synchronization purposes, among other possibilities.

In some embodiments, e.g., for synchrophasor embodiments, multiple power systems 75 may be measured concurrently. For example, one or more devices in the chassis 50 may be used for performing concurrent measurement, such as for synchrophasor and/or power quality analysis, among others. Further, the chassis 50 and/or devices included therein may be configured to perform measurements over a network, such as a wireless network (e.g., 802.11, WiMax, etc.). For example, in one embodiment, the devices may wireless communicate with sensors collocated with the power system 75.

As discussed herein, embodiments of chassis 50 may be used in test and measurement systems, such as systems used to acquire, process or output data relating to a device or process being monitored or controlled, for instance. Accordingly, such a system may acquire data, and subsequently transfer the data for processing, storage, output, or the like. For example, in the case of chassis 50 being used to control a process (e.g., a closed loop system), data may be acquired, transferred to a processor where it may be processed, and subsequently transferred to an output such that the processed output may be employed to appropriately control the respective process. In some embodiments, the chassis 50 and devices therein may be configured to operate as described in U.S. Pat. No. 7,366,631, which was incorporated in its entirety above.

Figure 2A:
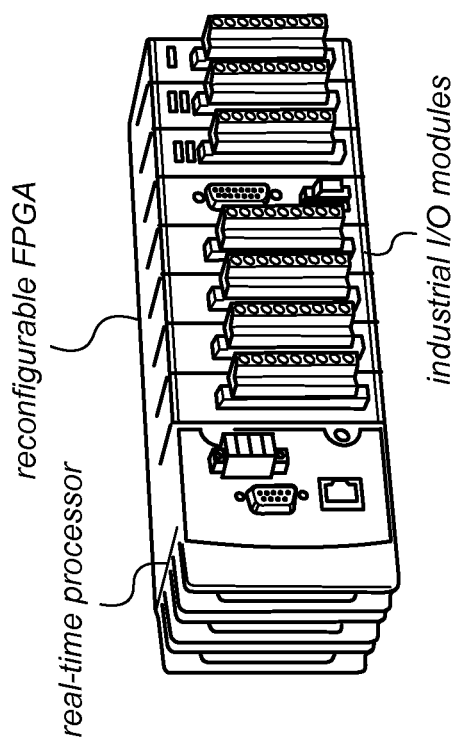
FIGS. 2-5 illustrate embodiments of a more specific system.

FIG. 1C illustrates host device 100 as a computer system. As shown in FIG. 2A, the host device 100 may be coupled to chassis 50 (e.g., including the first device 125 and the second device 150) and may include a display device and one or more input devices. Similar to descriptions of the host device 100 above, the host may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium. In alternate embodiments, the chassis 50 may include a host device and the computer system may be configured to communicate with the host device in the chassis 50. For example, the computer system may be used to configure the host device in the chassis 50 and/or the devices 125 and 150 also included in the chassis 50.

In various embodiments, the host device 100 may be coupled to a second computer system or device via a network (or a computer bus). The computer systems may each be any of various types, as desired. The network can also be any of various types, including a LAN (local area network), WAN (wide area network), the Internet, or an Intranet, among others. Similarly, the host device 100 may be coupled to the chassis 50 via various mechanisms.

FIGS. 2A-5—Specific Embodiment of an Exemplary System

The following provides a specific embodiment of an exemplary system that may implement embodiments described below. Note that these Figures and corresponding descriptions are exemplary only and do not limit the scope of the systems and methods described herein. In this example, the system may be implemented using a chassis, similar to descriptions above. More specifically, this embodiment uses a Compact RIO (reconfigurable input output) system that is provided by National Instruments. As shown in FIG. 2A, the chassis may include a real time processor portion (e.g., as a host device), a reconfigurable FPGA (or generically, a programmable hardware element) comprised in the backplane, and a plurality of pluggable industrial I/O modules.

Figure 2B:
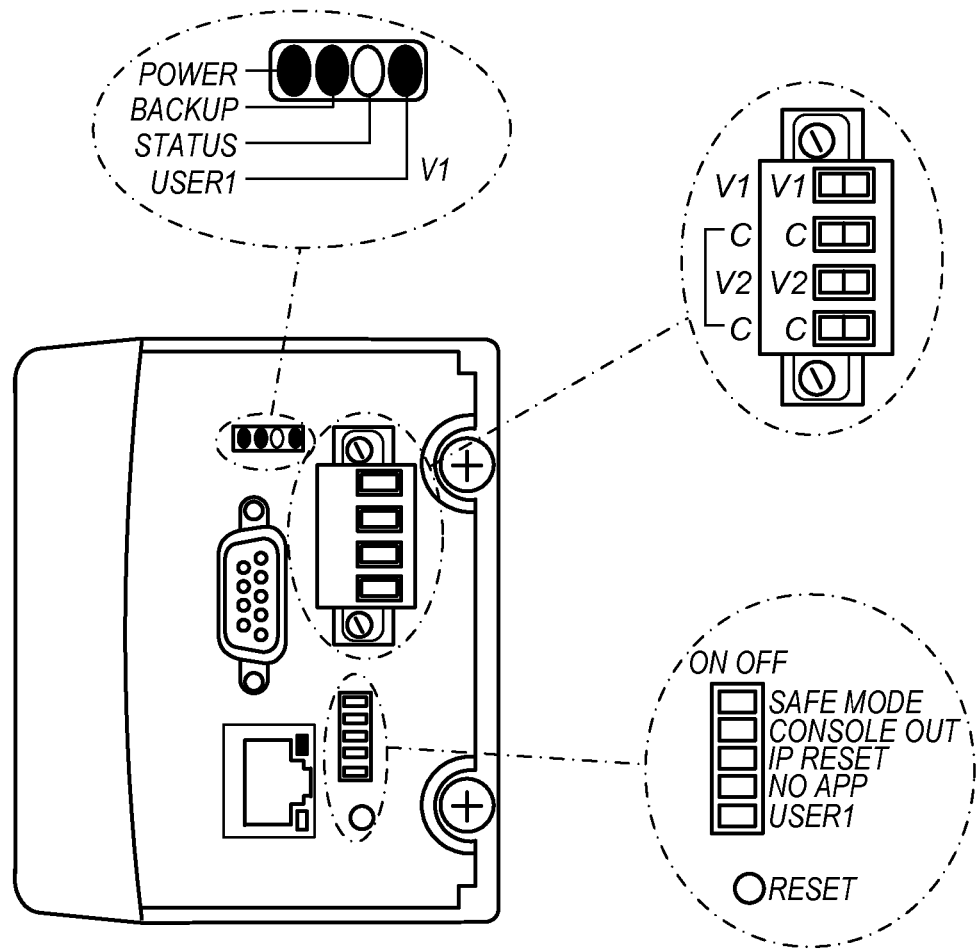

Further details of the real time processor are shown in FIG. 2B. More specifically, it may include a 200 MHz Pentium class processor (although other types are envisioned) and execute a real time operating system (e.g., a LabVIEW real time operating system), which may be able to perform various functions for real-time control, analysis, logging, communication, etc. Additionally, the real time processor portion may include an Ethernet port, a built-in web interface (e.g., for HTTP, FTP, VISA, email, etc.), data supply inputs (e.g., for backup supply input) as well as an RS-232 Serial Port (e.g., for GPS, keypad, display, bar code, etc.).

Figure 3A:
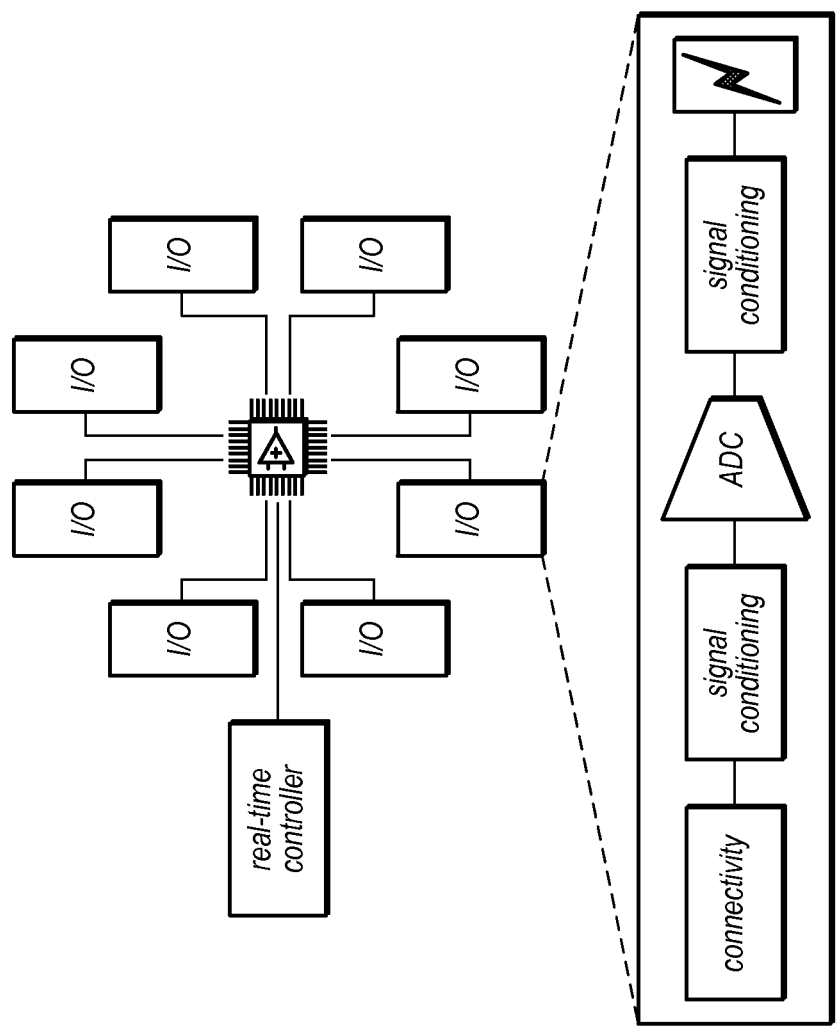
Figure 3B:
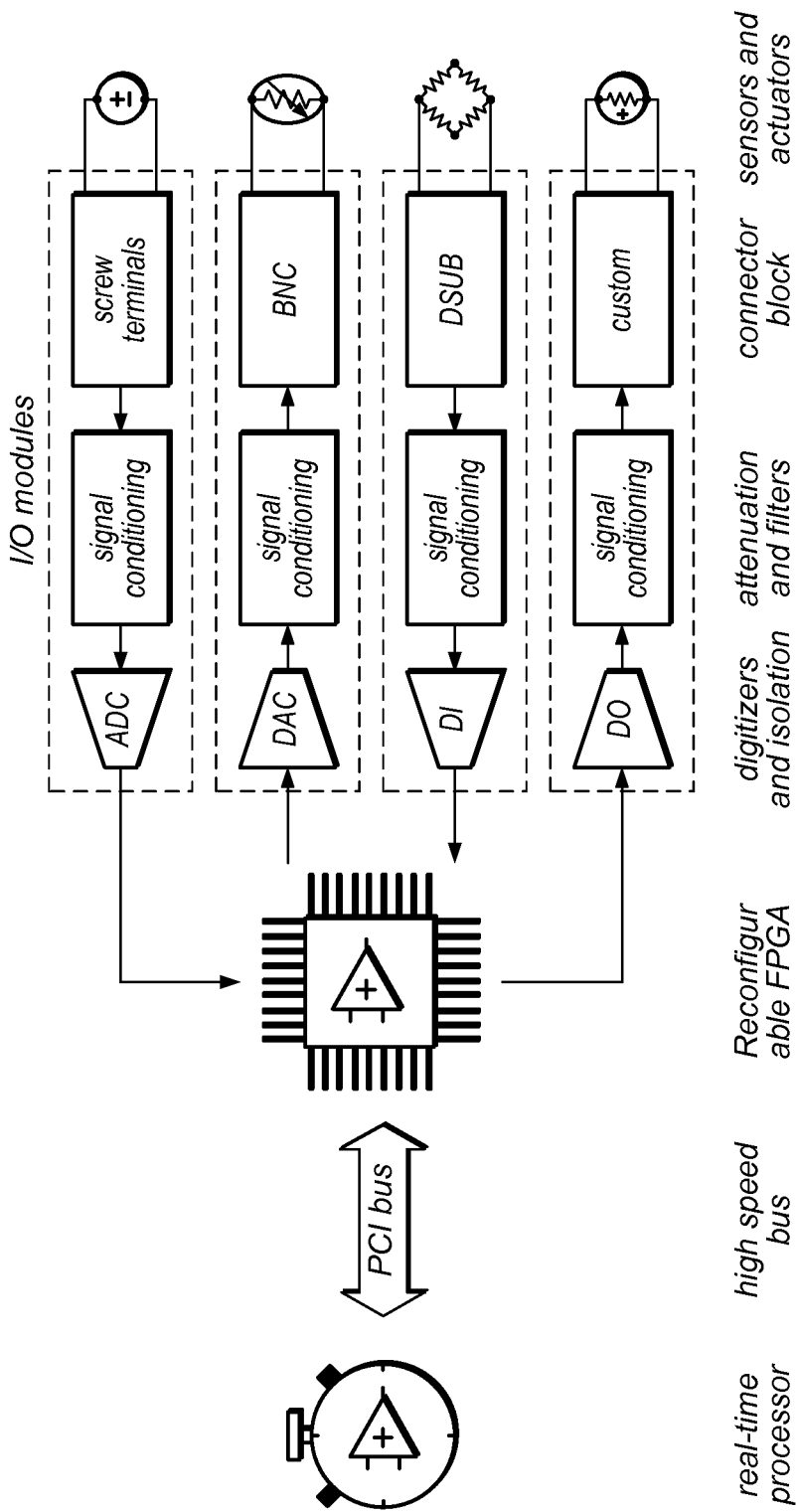

FIGS. 3A and 3B illustrate logical diagrams for the systems of FIGS. 2A and 2B. More specifically, as shown in FIG. 3A, each of the I/O modules may include connectivity, signal conditioning, analog to digital converters (ADCs), and further electronics. Each of these I/O modules may be coupled to the real-time controller over the backplane, e.g., implementing a portion of a graphical program.

FIG. 3B a similar logical block diagram for a specific case. As shown, a first I/O module may receive analog input from an actuator and/or sensor via screw terminals, perform signal conditioning, convert the analog signal to digital and provide it to the real time processing portion via the backplane. A next I/O module may receive output from the backplane (e.g., originating from the real time processing portion), convert the digital signal to analog, perform signal conditioning and provide the output to a sensor or actuator after BNC. A third I/O module may receive signals from an actuator or sensor via DSUB, perform signal conditioning, and digitization, and provide the output to the backplane (e.g., for provision to the real time processing portion). Finally, the fourth I/O module may receive output from the backplane (e.g., originating from the real time processing portion), perform digitization and signal conditioning, and provide output via a custom output to one or more sensors or actuators.

The real time processor may provide deterministic, stand-alone operation and advanced analysis. For example, in the embodiment of FIGS. 2A and 2B, the real time processor portion may act as a stand alone host device, e.g., which may be placed in a rugged environment (e.g., such as in a telephone pole or transmission tower, among other possibilities). The reconfigurable FPGA may provide high-speed and custom I/O timing, triggering, and control. The I/O modules may provide built-in signal conditioning for direct connection to sensors and/or actuators. In this particular embodiment, the data acquisition devices may not have programmable hardware elements.

Additionally, for embodiments regarding the power quality analyzer, the resampling algorithms discussed herein may be implemented via the reconfigurable FPGA while the further power quality parameter processing may be performed by the real time processor. For example, the real-time processor portion may perform calculation of power quality parameters based on even-angle signals, logging the calculated parameters onto disk as needed, publishing the calculated parameters wireless or wired through TCP/IP, UDP, HTTP, etc. Regarding embodiments for the synchrophasor measurements, the resampling algorithm and the phasor calculation may be implemented via the reconfigurable FPGA. For example, the real-time processor portion may be responsible for publishing the calculated magnitude, phase, frequency, and rate of frequency change wireless or wired through TCP/IP, UDP, HTTP, etc.

Figure 4:
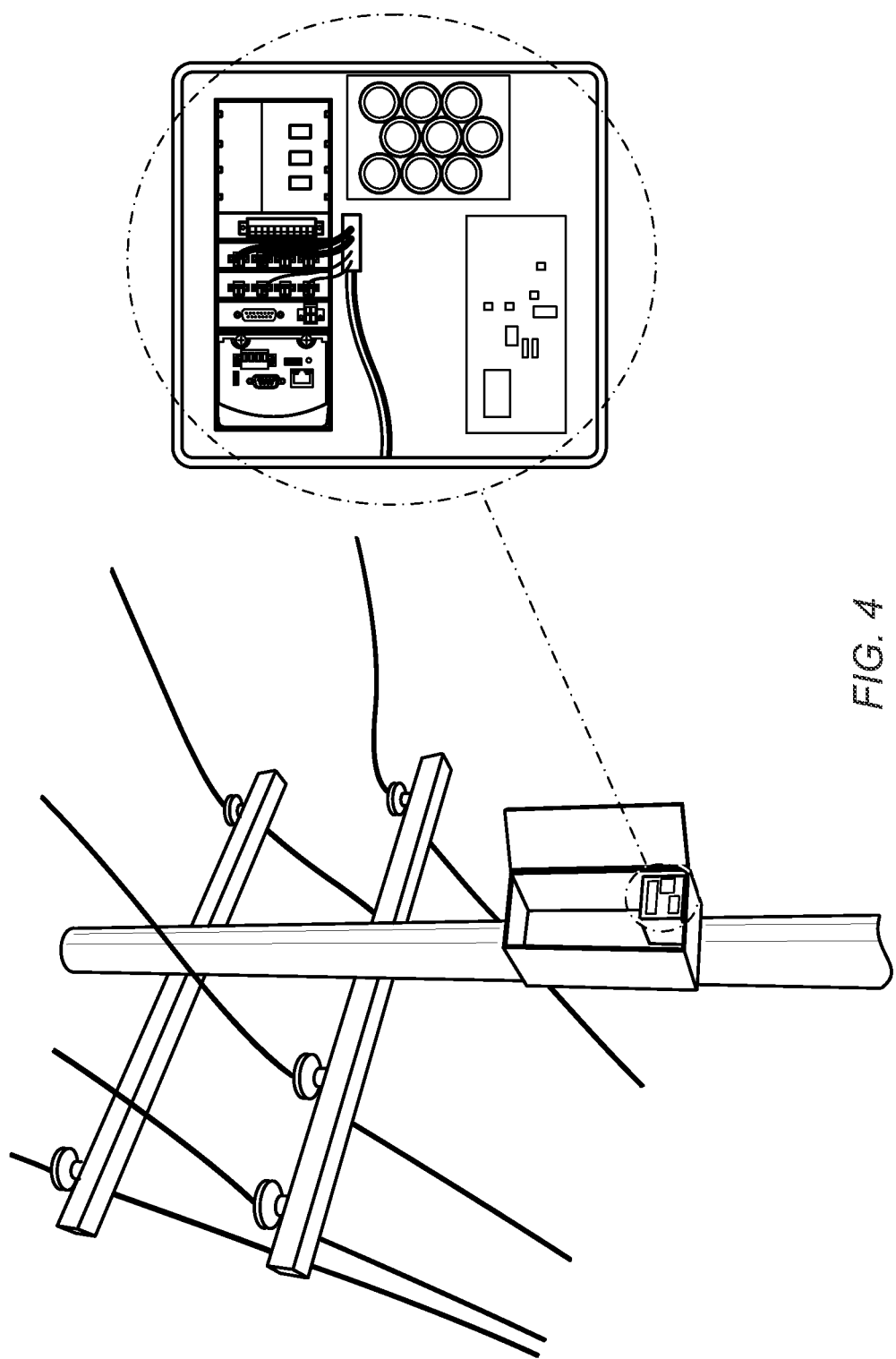

FIG. 4 illustrates an exemplary system for performing power quality analysis. More specifically, the system may be implemented within or near a power pole. For example, the system may be placed within a box of the power pole, which may include corresponding transformers and recloser(s). In addition to the elements shown in FIGS. 2A and 2B, other peripherals may be included, such as protection circuitry, back-up battery, signal conditioning components, etc. The system may be configured to perform power quality parameter measurements as discussed herein from the distribution wires and then publish the results to a centralized SCADA system wirelessly, although other variations are envisioned.

Figure 5:
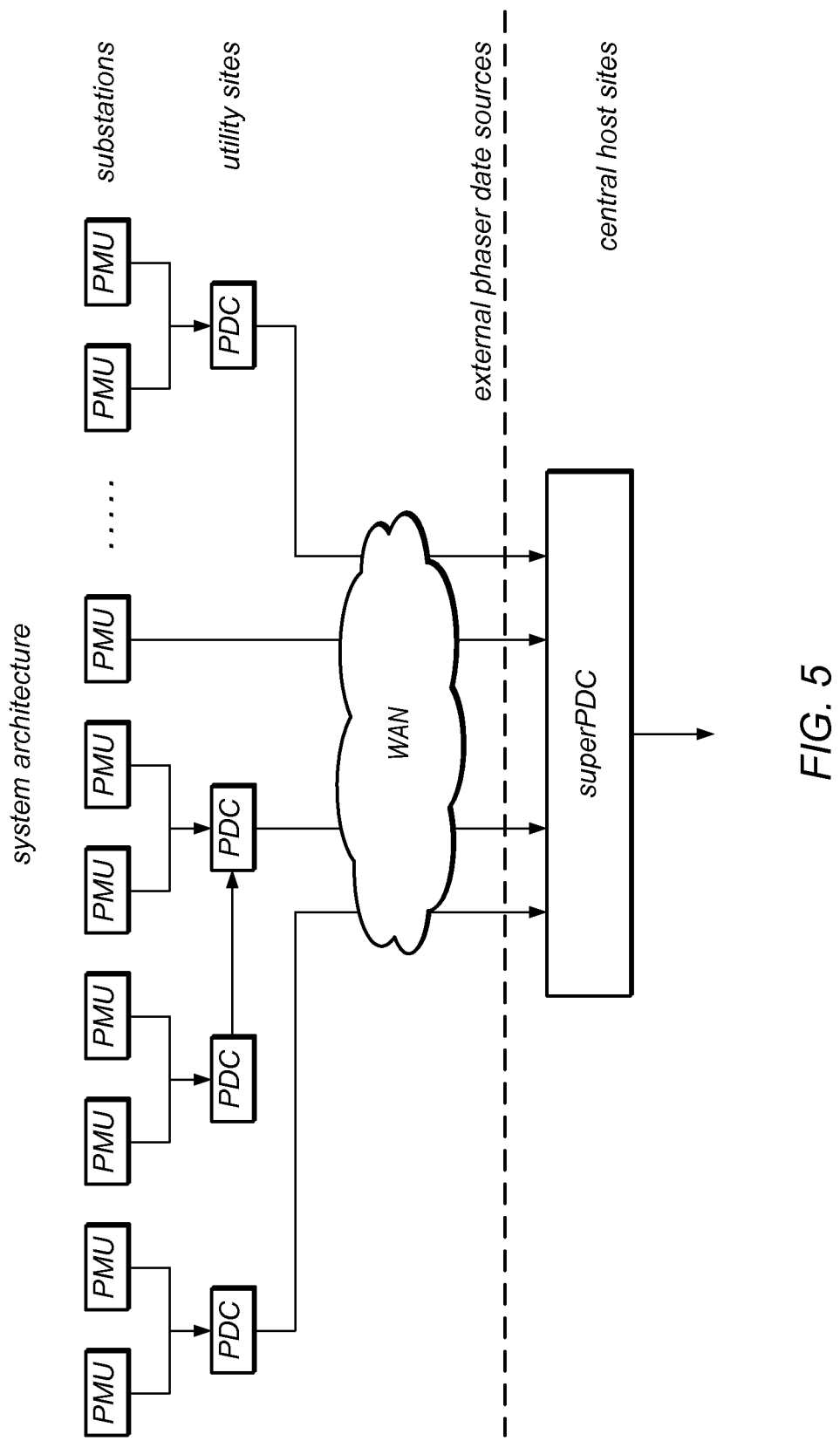

FIG. 5 illustrates an exemplary system architecture for a synchrophasor measurement system. More specifically, various PMUs (phasor measurement units) may be provided at various substations, which may stream data to local PDCs (phasor data concentrators), e.g., at utility centers, possibly via 4-wire or Ethernet links over a VPN connection. The PMUs may be implemented as a solid-state relay or digital fault recorder with a clock, such as a GPS clock. These PMUs may continuously measure voltages and current phasors (magnitudes and angles), and/or other key parameters, and transmit time stamped messages periodically (e.g., 10-60 times per second). The PDC may be implemented in software and/or hardware that may align, by time, the incoming PMU messages from multiple measuring devices and send out the aggregated synchronized data as a single data stream. The concentrator may also archive data and process the information. Further, it may be configured to exchange records with PDCs at other locations. This architecture may allow for utility-wide time synchronization for local applications. The PDCs at utility centers may in turn forward the data to a central PDC (or a SuperPDC) at the central host site, e.g., via VPN, for interconnection-wide time synchronization of the data.

As a further example, the system may be used in conjunction with a three-phase alternating current systems transmit power using three or four wires. Two common configurations for connections between wires and transformer coils are wye and delta. There can be different types of wiring between the transformer connection and the data acquisition device. For example, given a wye connection in a 3-phase voltage system, the wiring method can be three phase voltage channels/four current channels or three line voltage channels/four current channel. Accordingly, the voltage or current data acquisition device can be directly wired to the channels or through some voltage transformer or current transformer (or current clamp, current transducer, etc).

Figure 6:
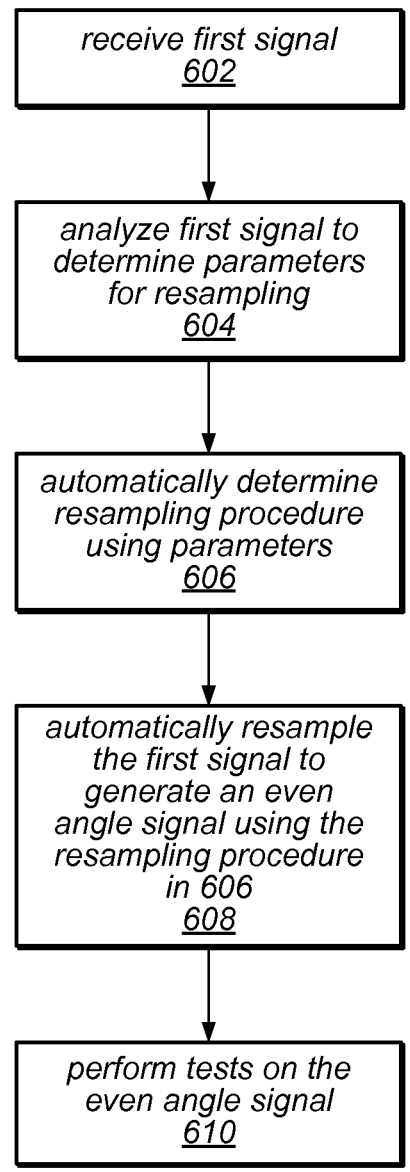
FIG. 6 is a flowchart diagram illustrating one embodiment of a method for performing arbitrary resampling.

FIG. 6—Generating Even Angle Signals for Measurement

FIG. 6 illustrates a method for generating even angle signals for measurement. The method shown in FIG. 6 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 602, a first signal may be received, e.g., and stored in a memory medium. The first signal may correspond to a power system, e.g., as acquired by the systems discussed above, among other possibilities. For example, the first signal may correspond to voltage and/or current of the power system. Furthermore, the first signal may have a plurality of cycles. In one embodiment, the cycles may correspond to a frequency of 50 Hz or a frequency of 60 Hz, or another frequency. However, these frequencies may vary within a range, e.g., for a 50 Hz system, the line frequency may vary between 42.5 to 57.5 Hz, and for a 60 Hz system, the line frequency may vary between 51 to 69 Hz. Note that the frequencies may be variable and therefore vary over time. In some embodiments, the first signal may be a digital signal, e.g., which was previously converted from an analog signal using an analog to digital converter (ADC). For example, a measurement device may measure the voltage and/or current of the power system and generate the first signal.

In 604, the first signal may be automatically analyzed or processed to generate one or more parameters. In one embodiment, the first signal may be initially filtered to generate a filtered first signal. The filtering may include band-pass filtering, which may remove harmonics and one or more low frequency components of the first signal. The filtered signal may be further processed to generate the one or more parameters.

For example, the method may perform zero crossing detection on the filtered signal. The zero crossing detection may determine start and end positions of each of the cycles in the first signal. More specifically, there may be two zero crossing points in each cycle of the first signal (e.g., which may be sinusoidal)—one rising edge and one falling edge. The start and end positions may be used to determine the even angle positions of the first signal. More specifically, two adjacent zero crossing points may be the start and end position of a half cycle of the signal. According to the desired number of samples per cycle, the even angle positions between every two zero crossing points may be calculated by linear interpolation. For example, if the desired number of samples is 192, there may be 96 even angle positions between two zero crossing points.

Additionally, the zero crossing detection (or some other process) may be used to determine a fundamental frequency of the first signal. More specifically, the fundamental frequency may be determined by calculating the time difference between two zero crossing points, which may correspond to half the period (1/(2*frequency)). Note that while the above describes performing zero crossing on the filtered signal, the zero crossing may be performed on the first signal (e.g., without being filtered), as desired.

Further, a sampling rate (which may also be referred to as anti-aliasing parameters) may be determined based on the zero crossing detection. More specifically, the new sampling rate may be the instantaneous fundamental frequency multiplied by the desired number of samples per cycle. For example, with a 50 Hz fundamental frequency and 192 samples per cycle, according to Nyquist theory, the cut-off frequency of the filter is 192*50/2, which is 4800 Hz. This sampling rate may ensure that the even angle signal produced in 608 is not aliased. Additionally, the ordering and specific processes outlined above may be added to, modified, or removed, as desired.

In 606, a resampling procedure may be automatically determined based on the determined parameters. For example, the even angle positions of the first signal (e.g., the filtered first signal) may be used to determine how and/or where to perform the resampling (e.g., in the time domain) in order to generate an even angle signal. Additionally, the anti-aliasing parameters may be used to avoid aliasing, e.g., by ensuring a proper sampling rate. In one embodiment, the parameters may be used to automatically generate (or modify a previous) filter design to perform the resampling in 608.

Accordingly, in 608, the first signal may be resampled at the even angle positions to produce an even angle signal, using the resampling procedure determined in 606. The even angle signal may be stored for further processing. The resampling may be achieved using the automatically determined filter discussed regarding 606 above. In some embodiments, the first signal may be resampled based on the fundamental frequency of the first signal, e.g., as determined in 604 above. In performing 602-608, an initial signal may be converted from an original frequency (e.g., which may vary over time) to a fixed number of samples per cycle, e.g., 128, 192, 256, 512, etc. samples per cycle. More specifically, the even angle signal may ensure that each cycle has a fixed number of samples rather than a variable number of samples per cycle. Thus, the original signal may be converted from the time domain to the cycle domain, which may have a fixed number of samples regardless of the variable frequencies of the original signal.

In one embodiment, e.g., for power quality analysis, with a desired number of samples per cycle of 192, the resampled even angle signal may be stored in a memory until it reaches 192*10 (or 12, depending on the case). However, this embodiment may apply to power quality analysis. For synchrophasor measurements, the even angle signal may be performed in a point by point manner.

In 610, one or more tests or measurements may be performed on the even angle signal. For example, the measurements may be used to perform power quality analysis of the power system providing the first signal. For example, the power quality analysis may include harmonic measurement, flicker measurement, unbalance measurement, dip/swell/interruption measurement, or any of the measurements discussed in the IEC 61000-4-30, among other standards and possible measurements. These measurements may be performed for 10 or 12 cycles. In one embodiment, the measurements may be used to perform synchrophasor analysis, e.g., the measurements associated with IEEE C37.118, among other standards and possible measurements. These measurements may require the consistency of the even angle signal that was not possible using the first signal (e.g., due to variable frequency). Additionally, these measurements may be performed on a point by point basis.

In one embodiment, both synchrophasor and power quality analysis measurements may be performed, e.g., by a common device. For example, the device may have one or more processing elements that may be configured to perform the resampling method described above. The processing element(s) may include programmable hardware elements, processors and memories, and/or circuits, which are configured to implement the described processing. Accordingly, these processing elements may be shared for performing both the synchrophasor and power quality analysis. Thus, instead of having two separate processes for performing the synchrophasor measurements and the power quality analysis, the processing elements implementing the resampling may be shared between the two measurement processes. Thus, for performing power quality analysis, an initial signal may be resampled in the manner described above using a first processing element. Once resampled, the resampled signal may be tested or monitored using power quality analysis measurements. Similarly, for performing synchrophasor measurements, an initial signal may be resampled using the same first processing element. Similarly, once resampled, the resampled signal may be tested or monitored using synchrophasor measurements. Thus, the same processing element (e.g., hardware) may be shared between the two types of measurements. This sharing may allow for more efficient and cheaper hardware for performing both power quality analysis and synchrophasor measurement.

Figure 7:
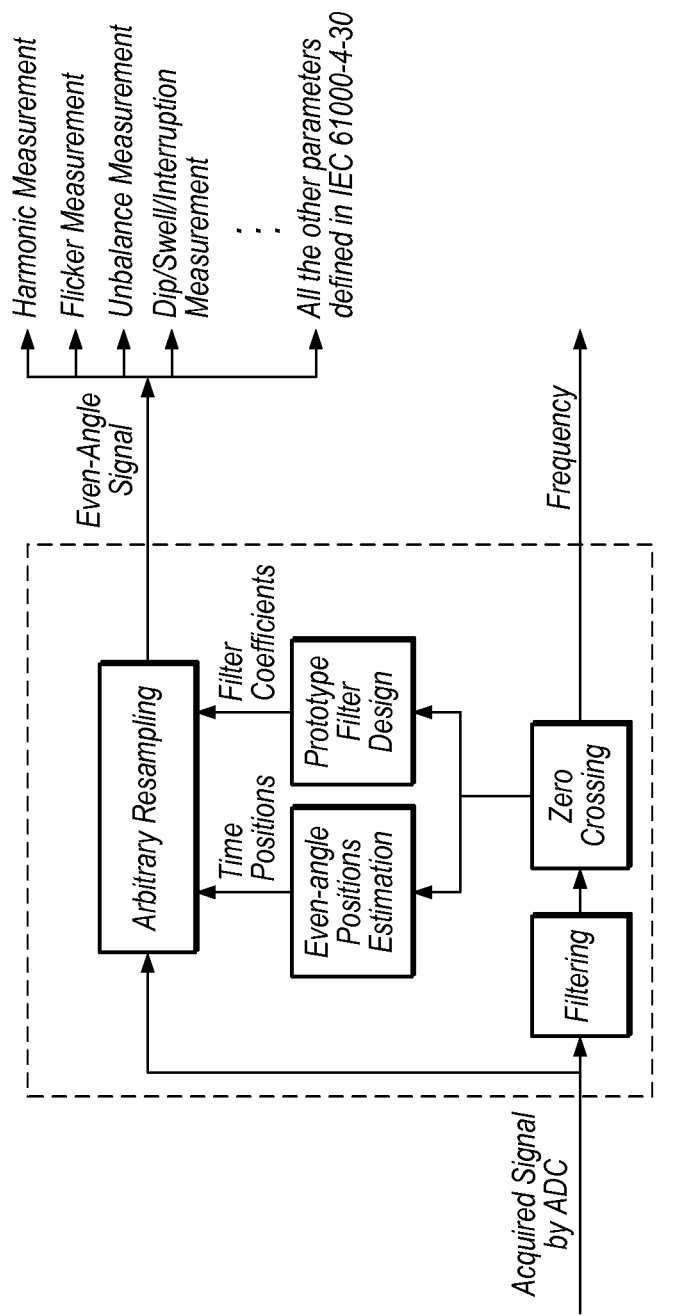
FIG. 7 is an exemplary block diagram of a system implementing one embodiment of the method of FIG. 6.

FIG. 7—Exemplary Block Diagram Corresponding to the Method of FIG. 6

FIG. 7 is an exemplary block diagram of a system implementing one embodiment of the method of FIG. 6.

More specifically, as shown in FIG. 7, a signal may be initially acquired after conversion from analog to digital. The signal may typically correspond to voltage or current signals acquired at even time spaced intervals, where a signal having a lower frequency has more samples per cycle than one of higher frequency.

The acquired signal may be provided to a filtering block as well as to an arbitrary resampling. In one embodiment, the filtering may be implemented using a band-pass filter on this time domain signal to remove the harmonics components and some low frequency components.

As shown, the output of the filter block may be provided to a zero crossing block. The zero crossing block may perform zero crossing detection on the filtered signal to determine the start and/or end time positions of each cycle and measure the fundamental frequency. Using the start and/or end time positions, depending on the desired number of samples per cycle, even angle positions (within the time domain) may be linearly interpolated based on the zero crossing points.

Additionally, one or more filter coefficients may be determined using the zero crossing output. For example, according to the sampling rate before resampling and after resampling, a prototype filter may be automatically redesigned with corresponding aliasing protection. The zero crossing detection may also be used to determine the frequency of the signal, as shown.

Finally, the digital signal acquired by the ADC may be resampled at the even angle time positions by the instantaneously redesigned prototype filter to generate an even angle signal. The even angle signal may be used to perform harmonic measurement, flicker measurement, unbalance measurement, dip/swell/interruption measurement, and/or any other measurements defined in IEC 61000-4-30, among others. Thus, based on the resampled signal, further processing is performed to measure all the parameters defined in IEC 61000-4-30 and it is easy to output them at 10/12-cycle interval regardless of the variable power system line frequency.

As one specific example, the resampling may be performed by a filter. For a low-pass filter, given a cut-off frequency, pass-band ripple, stop-band attenuation, roll-off factor, the digital filter's impulse response can be designed using a variety of design methods. In one embodiment, the method may be implemented using an equal-ripple design. In one specific embodiment, all of the filter's parameters except cut-off frequency may be fixed, but cut-off frequency could be changed due to the line frequency change in power system. Thus, the prototype filter design's input may be the instantaneous fundamental frequency (e.g., returned by zero-crossing detection) and the desired number of samples per cycle. The output may be the digital filter's impulse response or, in other words, its time domain coefficients.

Figure 8A:
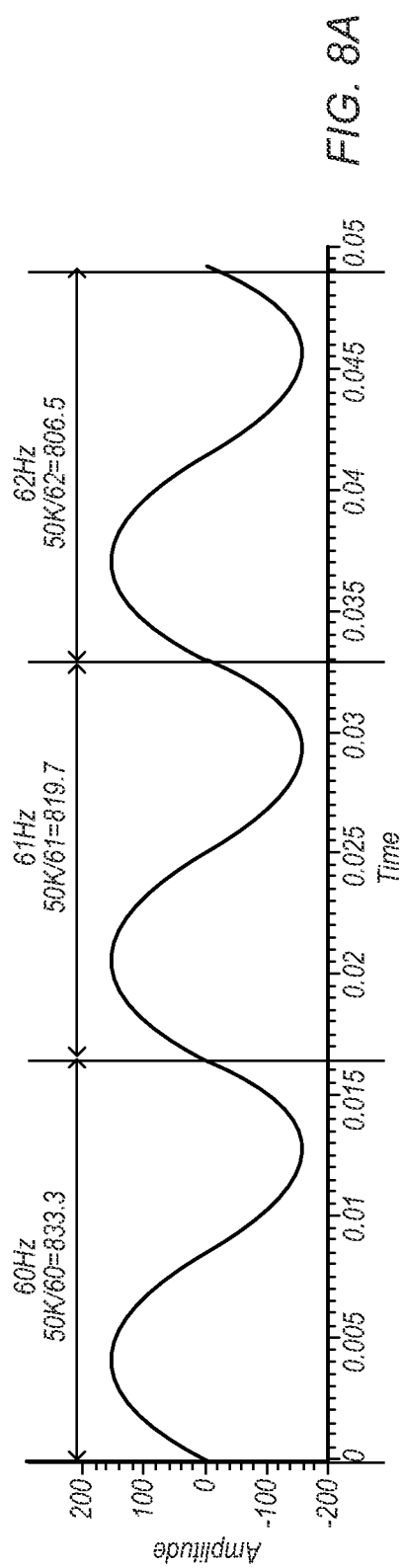
FIGS. 8A and 8B are exemplary signals before and after processing, according to one embodiment.
Figure 8B:
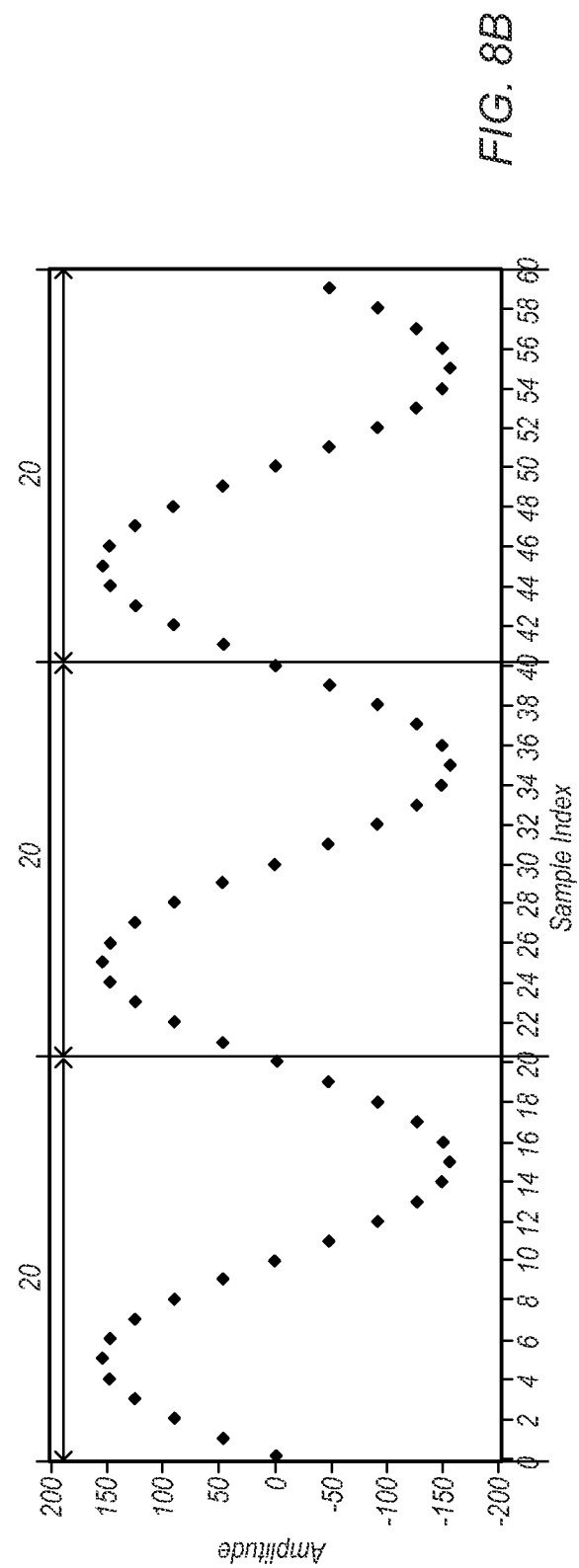

FIGS. 8A and 8B—Exemplary Signals Before and After Processing

FIGS. 8A and 8B illustrate exemplary signals before and after processing, e.g., according to the method of FIG. 6 and/or the block diagram of FIG. 7.

More specifically, FIG. 8A illustrates an exemplary signal where, before resampling, the number of acquired samples from the analog to digital converter may vary as the line frequency changes. More specifically, as shown, the signal includes a first cycle at 60 Hz, a second cycle at 61 Hz, and a third cycle at 62 Hz.

As shown in FIG. 8B, after resampling, regardless of the original frequencies of the cycles, the number of samples per cycle is the same. In this particular example, 20 samples per cycle are shown for exemplary purposes only; however, a more common sampling rate would be 128 samples per cycle.

Figure 9:
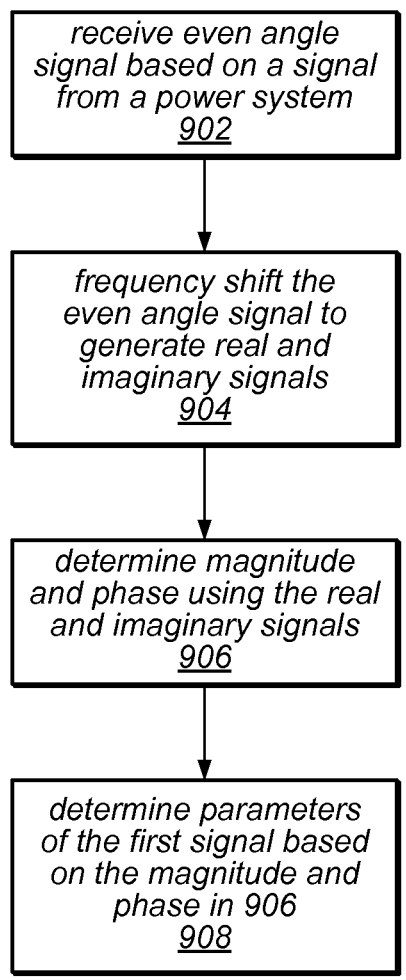
FIG. 9 is a flowchart diagram illustrating one embodiment of a method for performing synchrophasor measurement.

FIG. 9—Performing Synchrophasor Measurements Using an Even Angle Signal

FIG. 9 illustrates a method for performing synchrophasor measurements using an even angle signal, e.g., according to the method of FIG. 6. The method shown in FIG. 9 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 902, an even angle signal may be received, e.g., that is based on an initial first signal. For example, the even angle signal may be received using embodiments described above regarding FIGS. 6 and 7, based on a similar first signal.

In 904, the even angle signal may be frequency shifted (e.g., fundamental frequency shifted) to produce a real signal (corresponding to the real portion of the even angle signal) and an imaginary signal (corresponding to the imaginary portion of the even angle signal). For example, a cosine function may be applied to the even angle signal to produce the real signal and a sine function may be applied to the even angle signal to produce the imaginary signal. In some embodiments, the even angle signal may be initially decimated before performing the frequency shift.

In 906, magnitude and phase may be determined using the real signal and the imaginary signal. In some embodiments, an initial phase may be determined and the initial phase may be integrated to determine the instantaneous phase. The magnitude may also be the instantaneous magnitude. In one embodiment, this determination may involve converting the real signal and the imaginary signal to the polar domain in order to determine the magnitude and phase (e.g., the instantaneous magnitude and the initial or instantaneous phase). In some embodiments, this determination may be preceded by filtering the real signal and the imaginary signal to produce a filtered real signal and a filtered imaginary signal. For example, filtering the real signal and the imaginary signal may include performing low pass filtering of the real signal and the imaginary signal, which may remove harmonics and out of band components of the real signal and the imaginary signal.

In 908, parameters or measurement results based on the first signal and/or even angle signal may be determined based on the magnitude and phase in 906. For example, 908 may include determining phasor, frequency, and/or rate of frequency change for the first signal using the magnitude and phase of 906. These parameters may also be determined based on a frequency of the first signal. The frequency of the first signal may have been previously determined, e.g., using a zero crossing detection. In order to determine these parameters or characteristics, the frequency, instantaneous magnitude, and/or instantaneous phase may be first synchronized (e.g., using time stamps, possibly generated using GPS timing). This synchronization may require delaying one or more of the signals, such as the frequency, which may have been previously determined.

In one embodiment, the method of FIG. 9 illustrates one possible embodiment for performing further processing on the outputted even angle signal from FIG. 6, e.g., to perform synchrophasor measurements, such as to perform measurements based on the IEEE C37.118 standard, among other possibilities.

Figure 10:
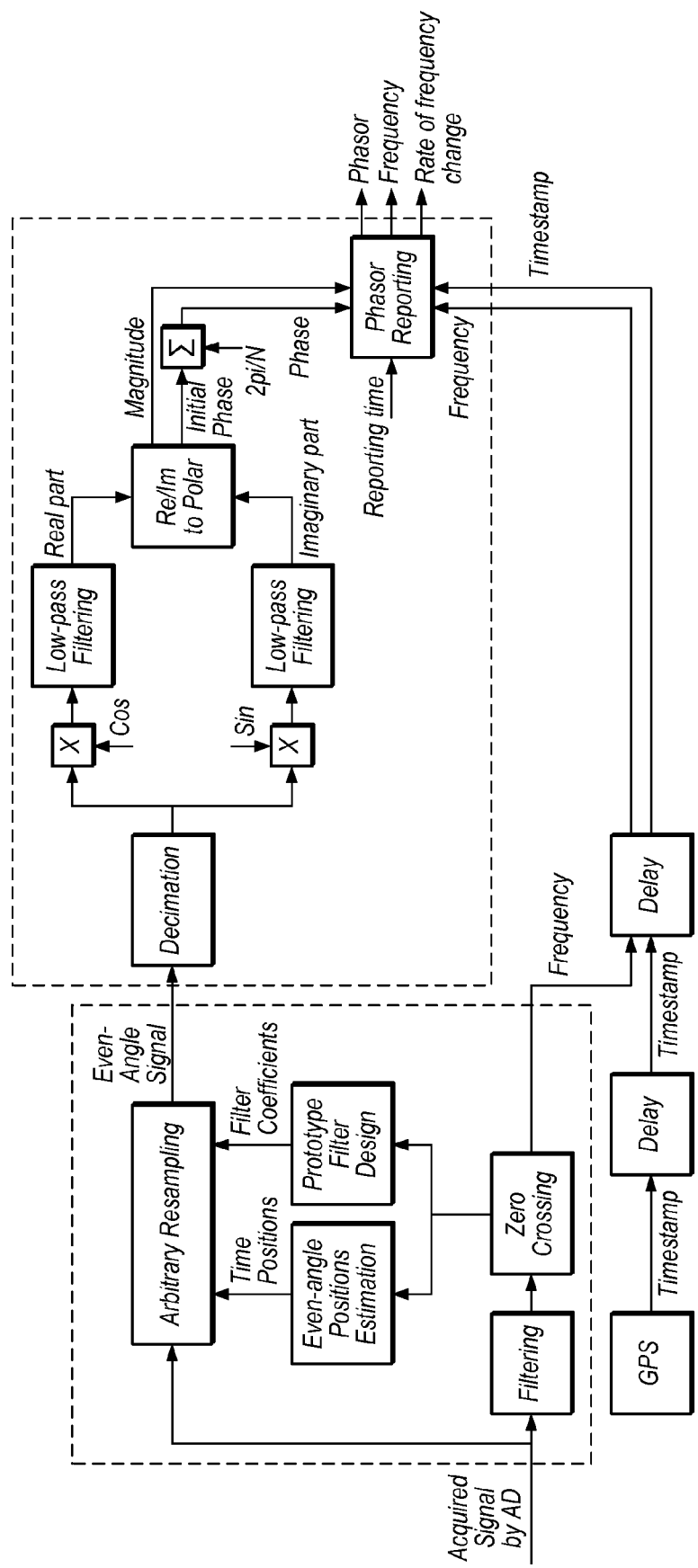
FIG. 10 is an exemplary block diagram of a system implementing one embodiment of the method of FIG. 9.

FIG. 10—Exemplary Block Diagram Corresponding to the Method of FIG. 4

FIG. 10 is an exemplary block diagram of a system implementing one embodiment of the method of FIG. 9.

More specifically, as shown in FIG. 10, the initial signal may be processed in the manner shown in FIG. 6. The even angle signal may then be provided to a decimation block. In one specific embodiment, for power quality measurement, in order to measure up to the $50^{th}$ harmonic, at least 128 samples per cycle may be required. Decimation may be performed on the resampled signal in order to facilitate the further filter design and computation.

In the angular domain, the fundamental of the signal may not vary in "angular frequency" so it may be much easier to isolate and analyze. Accordingly, frequency shifting may be performed to shift the fundamental component to DC, which introduces the real part and imaginary part. More specifically, as shown, a sine and cosine function may be applied to the decimated signal separately to generate real and imaginary portions.

As also shown, these portions may be filtered using low pass filters. More specifically, since the fundamental component is moved to DC, applying a low-pass filter on both real part and imaginary part may remove the harmonics components and the out-of-band components.

These two portions may then be converted and/or combined to the polar domain to determine instantaneous magnitude and the initial phase. More specifically, these parameters may be calculated from the filtered real part and imaginary part.

The phase may be integrated to determine the instantaneous phase. More specifically, since the resampled signal is even angle spaced, the phase difference between adjacent point may be 2*pi/samples per cycle. Using the initial phase, the integrated result is the instantaneous phase.

As shown, in order to synchronize the timestamp returned by GPS and the processed data, exactly the same delay as the processing is introduced. For example, the same delay as arbitrary filtering is introduced so as to synchronize the timestamp and output frequency. Then, the same delay as resampled signal post processing is introduced so as to synchronize magnitude and phase with the frequency previously determined using the zero crossing detection.

Once the instantaneous magnitude, phase, and frequency are synchronized with corresponding timestamp, the reported phasor, frequency and rate of frequency change at the universal reporting time is obtained and may be used for measurement, such as synchrophasor measurement.

Exemplary Embodiments Using Graphical Programs

In some embodiments, the particular processing described above may be implemented using a graphical program. More specifically, the graphical program may include a plurality of nodes interconnected by wires. The graphical program may be created on the computer system, such as the computer system shown in FIG. 1C. The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons which visually indicates the functionality of the program. The graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In an alternate embodiment, the graphical program may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired.

The graphical program may implement the signal processing described above (e.g., all or portions of the methods described regarding FIGS. 6-10). Additionally, the graphical program may be implemented by a device (e.g., such as the chassis 50 or cards within chassis 50) via a processor and memory medium and/or a programmable hardware element. In some embodiments, the graphical program may be distributed among a plurality of devices to perform the described processing.

Advantages

Embodiment described above provides a method for measuring power quality parameters, e.g., defined in IEC 61000-4-30, and/or synchrophasor measurements, e.g., defined in IEEE C37.118, among other possibilities.

IEC 61000-4-30 defines the measurement methods and the uncertainty compliance level of a series of power quality parameters. The basic measurement time interval of these parameters defined in this standard is 10-cycle for a 50 Hz power system or 12-cycle for a 60 Hz power system, which also requires that the number of samples per cycle should be the same. In the embodiments described above, using arbitrary resampling, the digital signal acquired by ADC may be resampled at arbitrary time locations with corresponding aliasing protection based on instantaneous sampling rate. Even if the power system's line frequency is variable, the signal acquired by ADC may be sampled at even angles, e.g., where each cycle has the same number of samples. As discussed above, once the resampled signal is calculated, further processing can be performed on the signal to measure all the power quality parameters at 10 or 12-cycle time interval. Using the described embodiments, a power quality analyzer can be compliant with Class A of measurement methods and uncertainty defined in IEC 61000-4-30.

IEEE C37.118 defines the definition, requirements and the compliance verification of synchrophasor measurement. The above described embodiments may have the capability to estimate the frequency precisely after pre-filtering and extract the resampled signal with the same number of samples per cycle to estimate the fundamental component's magnitude and phase precisely. Using these embodiments, a phasor measurement unit can be compliant with Level 1 of accuracy limits defined in IEEE C37.118.

As discussed above, another benefit of these embodiments is the integrated use case with both power quality measurement and synchrophasor measurement. More specifically, the arbitrary resampling component can be shared so as to save a lot of computational resources. For example, the processing algorithm of FIGS. 2 and 3 may be shared (e.g., using common hardware or resources) for both measurements, as desired. Thus, in one specific embodiment, a common measurement device may be ability to perform measurements for both power quality and synchrophasor.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for performing power quality measurement, comprising:
    measuring, by at least one power signal measurement device configured with power quality analysis functionality, power of a power system, wherein said measuring produces a first power signal, wherein the first power signal is stored in a memory, and wherein the stored first power signal comprises a plurality of cycles;
    applying, by the at least one power signal measurement device, a filter to the stored first power signal, thereby generating a stored filtered first power signal;
    performing, by the at least one power signal measurement device, zero crossing detection on the stored filtered first power signal, wherein said performing zero crossing detection comprises determining start and end positions of each of the plurality of cycles;
    determining, by the at least one power signal measurement device, even angle positions and a fundamental frequency for each cycle of the plurality of cycles of the stored first filtered power signal based on the determined start and end positions;
    resampling, by the at least one power signal measurement device, the stored filtered first power signal at the even angle positions based on the fundamental frequency to produce an even angle power signal, wherein the even angle power signal is stored in the memory; and
    performing, by the at least one power signal measurement device, one or more power quality measurements of the power system using the even angle power signal to perform power quality measurement of the power system.

2. The method of claim 1, further comprising:
    generating a prototype filter design based on said performing zero crossing detection on the stored filtered first rower signal;
    wherein said resampling the stored filtered first power signal at the even angle positions comprises using the prototype filter design.

3. The method of claim 1, further comprising:
    determining one or more parameters of the stored filtered first power signal, wherein said determining the one or more parameters comprises:
        determining a sampling rate for performing said resampling based on said performing zero crossing detection without aliasing;
    wherein said resampling uses the sampling rate.

4. The method of claim 1, wherein a frequency of the stored first power signal is variable.

5. The method of claim 1, wherein the stored first power signal corresponds to voltage or current output by the power system.

6. The method of claim 1, wherein said filtering the stored first power signal removes harmonics and one or more low frequency components of the first power signal.

7. A system for performing power measurement, comprising:
    a power signal measurement device configured with power quality analysis functionality, wherein the power signal measurement device comprises:
        a memory;
        an input for receiving an analog signal produced by at least one power signal measurement device configured with power quality analysis functionality measuring power of a power system;
        an analog to digital converter (ADC) coupled to the input, wherein the ADC is configured to convert the analog signal to a first rower signal;
        one or more processing elements coupled to the ADC, wherein the one or more processing elements are configured to:
            store the first power signal in a memory, wherein the first power signal comprises a plurality of cycles;
            apply a filter to the first power signal, thereby generating a filtered first power signal;
            perform zero crossing detection on the filtered first power signal, wherein said performing zero crossing detection comprises determining start and end positions of each of the plurality of cycles; and
            determine even angle positions and a fundamental frequency for each cycle of the plurality of cycles of the filtered first power signal based on the determined start and end positions;
            resample the filtered first power signal at the even angle positions based on the fundamental frequency to produce an even angle power signal, wherein the even angle power signal is stored in the memory;

perform one or more power quality measurements of the power system using the even angle power signal to perform the power quality measurement of the power system.

8. The system of claim 7, wherein the system is comprised in a chassis, wherein the chassis comprises a plurality of cards inserted into the chassis, wherein at least one of the one or more processing elements is implemented on a card inserted into the chassis.

9. The system of claim 7, wherein the one or more processing elements comprise a programmable hardware element, wherein the programmable hardware element is configured to implement at least a portion of said receiving, said applying a filter, said determining, said resampling, or said performing.

10. The system of claim 9, wherein the programmable hardware element is configured according to a graphical program, wherein the graphical program comprises a plurality of nodes interconnected by wires which visually indicates functionality of the graphical program.

11. The system of claim 7, wherein the one or more processing elements comprise circuitry, wherein the circuitry is configured to implement at least a portion of said receiving, said applying a filter, said determining, said resampling, or said performing.

12. The system of claim 7, wherein the one or more processing elements comprise a processor and memory, wherein the memory stores program instructions executable by the processor to implement at least a portion of said receiving, said applying a filter, said determining, said resampling, or said performing.

13. The system of claim 7, wherein the one or more processing elements are further configured to determine one or more parameters of the filtered first power signal, wherein said determining one or more parameters comprises:

analyzing the filtered first power signal; and determining a sampling rate based on said analyzing, wherein said resampling is based on the determined sampling rate.

14. The system of claim 7, wherein the analog signal corresponds to voltage or current output by the power system.

15. A non-transitory, computer accessible memory medium storing program instructions for performing power measurement, wherein the program instructions are executable by a processor of a power signal measurement device configured with power quality analysis functionality to:

store, by the power signal measurement device, a first power signal in a memory, wherein the stored first power signal was produced by at least one power signal measurement device configured with power quality analysis functionality measuring power of a power system, and wherein the stored first power signal comprises a plurality of cycles;

apply, by the power signal measurement device, a filter to the stored first power signal, thereby generating a stored filtered first power signal;

perform, by the power signal measurement device, zero crossing detection on the stored filtered first power signal, wherein said performing zero crossing detection comprises determining start and end positions of each of the plurality of cycles;

determine, by the power signal measurement device, even angle positions and a fundamental frequency for each cycle of the plurality of cycles of the stored filtered first power signal based on the determined start and end positions;

resample, by the power signal measurement device, the stored filtered first power signal at the even angle positions based on the fundamental frequency to produce an even angle signal, wherein the even angle signal is stored in the memory;

perform, by the power signal measurement device, one or more power quality measurements of the power system using the even angle power signal to perform the power quality measurement of the power system.

16. The non-transitory, computer accessible memory medium of claim 15, wherein the program instructions are further executable by a processor of the power signal measurement device configured with power quality analysis functionality to determine one or more parameters of the stored filtered first power signal, wherein said determining one or more parameters comprises:

analyzing the stored filtered first power signal; and determining a sampling rate based on said analyzing, wherein said resampling is based on the determined sampling rate.

* * * * *

UNITED STATES PATENT AND TRADEMARK OFFICE
CERTIFICATE OF CORRECTION

PATENT NO.         : 9,188,611 B2                                Page 1 of 1
APPLICATION NO.    : 13/326626
DATED              : November 17, 2015
INVENTOR(S)        : Guao et al.

It is certified that error appears in the above-identified patent and that said Letters Patent is hereby corrected as shown below:

IN THE CLAIMS:

Claim 2:
Column 16, Line 18, please delete "rower" and substitute -- power --.

Claim 7:
Column 16, Line 50, please delete "rower" and substitute -- power --.

Signed and Sealed this
Twenty-third Day of February, 2016

Michelle K. Lee
*Director of the United States Patent and Trademark Office*